(12) United States Patent
Matsuoka

(10) Patent No.: US 11,929,256 B2
(45) Date of Patent: Mar. 12, 2024

(54) WAFER PROCESSING METHOD AND GRINDING APPARATUS

(71) Applicant: DISCO CORPORATION, Tokyo (JP)

(72) Inventor: Yuya Matsuoka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 213 days.

(21) Appl. No.: 17/447,843

(22) Filed: Sep. 16, 2021

(65) Prior Publication Data

US 2022/0115237 A1 Apr. 14, 2022

(30) Foreign Application Priority Data

Oct. 13, 2020 (JP) ................................. 2020-172605

(51) Int. Cl.
*H01L 21/304* (2006.01)
*B24B 7/22* (2006.01)
*H01L 21/683* (2006.01)

(52) U.S. Cl.
CPC ............ *H01L 21/304* (2013.01); *B24B 7/228* (2013.01); *H01L 21/6836* (2013.01)

(58) Field of Classification Search
CPC ....... B24B 7/228; B24B 37/04; B24B 37/042; B24B 37/10–107; B24B 37/30–34; H01L 21/304; H01L 21/6836
USPC .............. 451/41, 29, 30, 285, 287, 289, 290
See application file for complete search history.

(56) References Cited

U.S. PATENT DOCUMENTS

| | | | | |
|---|---|---|---|---|
| 6,910,403 | B1* | 6/2005 | Ishikawa | H01L 21/6836 |
| | | | | 257/E21.599 |
| 9,773,660 | B2* | 9/2017 | Kim | H01L 21/304 |
| 10,297,501 | B2* | 5/2019 | Agari | B23K 26/53 |
| 10,438,898 | B2* | 10/2019 | Nakamura | H01L 21/78 |
| 2007/0105348 | A1* | 5/2007 | Sekiya | H01L 21/78 |
| | | | | 438/464 |
| 2010/0243159 | A1* | 9/2010 | Nishio | B32B 27/20 |
| | | | | 156/764 |

FOREIGN PATENT DOCUMENTS

| | | | | |
|---|---|---|---|---|
| JP | 2018160627 A | * | 10/2018 | ............. B24B 37/00 |
| JP | 2018160627 A | | 10/2018 | |
| JP | 2019102769 A | | 6/2019 | |

OTHER PUBLICATIONS

Machine translation of JP-2018160627-A (Year: 2018).*
Search report issued in counterpart Singapore patent application No. 10202110464T, dated Dec. 5, 2022.

* cited by examiner

*Primary Examiner* — Joel D Crandall
*Assistant Examiner* — Robert F Neibaur
(74) *Attorney, Agent, or Firm* — Greer Burns & Crain Ltd.

(57) ABSTRACT

A wafer processing method for processing a wafer having a chamfered portion formed at a periphery thereof includes a tape attaching step of attaching a protective tape to a front surface of the wafer and making a diameter of the protective tape coincide with a diameter of the wafer; a grinding step of grinding a back surface of the wafer held by a holding table with use of grinding stones so as to thin the wafer to a thickness thinner than half of an original thickness, to reduce the diameter of the wafer, and to form a protruding portion where the protective tape protrudes from the wafer; and a contracting step of heating and contracting the protruding portion of the protective tape after the grinding step is carried out.

10 Claims, 9 Drawing Sheets

FIG.5A
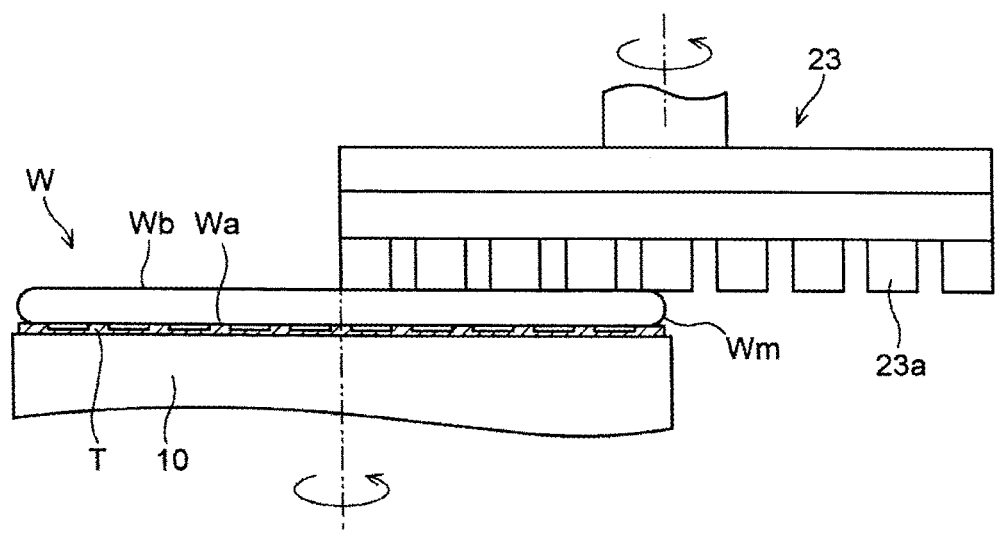
FIG.5B
FIG.5C
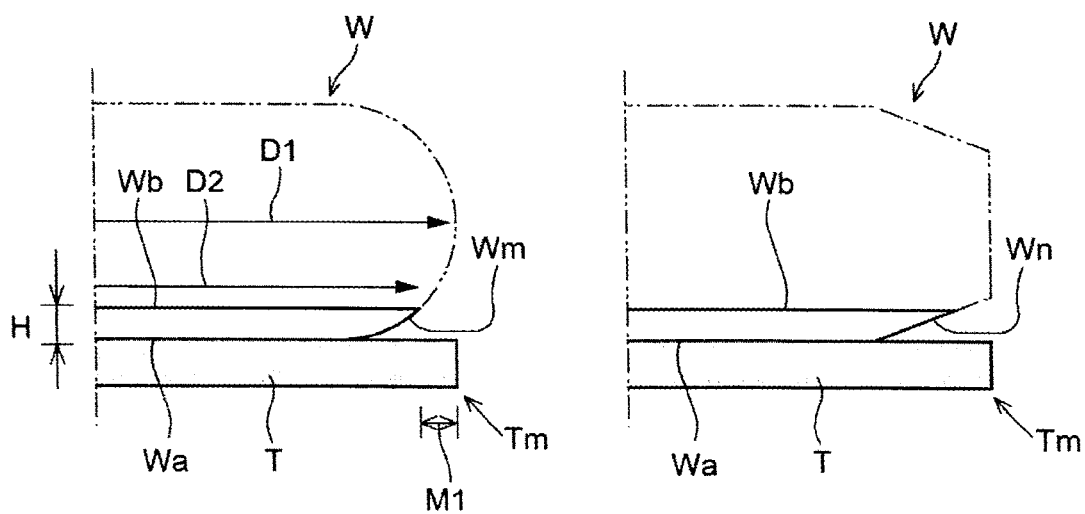

WAFER PROCESSING METHOD AND GRINDING APPARATUS

BACKGROUND OF THE INVENTION

Field of the Invention

The present invention relates to a wafer processing method for processing a wafer having a chamfered portion formed at a periphery thereof, and a grinding apparatus.

Description of the Related Art

Conventionally, when a back surface of a wafer (semiconductor wafer) is to be ground in a manufacturing process of semiconductor devices, a protective tape is attached to a front surface of the wafer in order to protect devices formed on the front surface of the wafer.

After the back surface of the wafer is ground, the protective tape is peeled off by using a peel tape, for example. At the time of peeling off the protective tape, a peel tape (tape for peeling) having a strong adhesive force is attached to the protective tape and then pulled up, so that the protective tape is peeled off from the wafer together with the peel tape.

Specifically, as illustrated in FIG. 9A, a protective tape 72 is attached to a front surface 70a side of a wafer 70, and a back surface 70b side of the wafer 70 is ground. After the grinding of the back surface 70b side, as illustrated in FIG. 9B, the wafer 70 is placed upside down such that the back surface 70b side is attached to a dicing tape 74, and a peel tape 76 is pressed against and attached to the protective tape 72 so as to stride across an edge portion of the protective tape 72. The peel tape 76 is then pulled up, thereby peeling off the protective tape 72 from the wafer 70.

Japanese Patent Laid-open No. 2019-102769 discloses a configuration of a tape cutter (tape cutter for peeling) for supplying, attaching, and cutting such a peel tape (tape for peeling).

SUMMARY OF THE INVENTION

It is important to attach the peel tape 76 to an outer peripheral edge of the protective tape 72 as illustrated in FIG. 9B. If the peel tape 76 is not attached to the outer peripheral edge but to a portion of the protective tape 72 on an inner side relative to the outer peripheral edge, it is difficult to peel off the protective tape 72 from the wafer 70 at the time of pulling up the peel tape 76. In this case, there is a possibility that the peel tape 76 is peeled off from the protective tape 72, resulting in failure of peeling of the protective tape 72.

Meanwhile, as illustrated in FIG. 9A, an outer periphery of the wafer 70 is chamfered for enhancing handling property and preventing damages, and an arcuate cross section is formed between the front surface 70a and the back surface 70b to form a chamfered portion 70m. Therefore, when the wafer 70 having the protective tape 72 attached to the front surface 70a thereof is ground on the back surface 70b side to be thinned to 50 μm, for example, the protective tape 72 becomes larger in diameter than the wafer 70, so that the protective tape 72 protrudes from the front surface 70a of the wafer 70 by a protruding amount M to form a protruding portion 72m.

If the peel tape 76 is to be attached to the outer peripheral edge of the protective tape 72 as illustrated in FIG. 9B in the state in which the protective tape 72 is larger in diameter than the wafer 70 as described above, the protruding portion 72m of the protective tape 72 protruding from the wafer 70 sticks to the dicing tape 74, making it difficult to peel off the protective tape 72.

Especially, in the case of using a dicing tape with a die attach film (DAF), if the protective tape attached to the DAF is peeled off forcibly, there is a possibility that the DAF is peeled off from the dicing tape.

Accordingly, an object of the present invention is to provide a wafer processing method and a grinding apparatus by which it is possible to suppress occurrence of defects caused by protrusion of a protective tape from the front surface of a wafer that has been ground on the back surface side thereof and has a reduced diameter.

In accordance with an aspect of the present invention, there is provided a wafer processing method for processing a wafer having a chamfered portion formed at a periphery thereof. The wafer processing method includes a tape attaching step of attaching a protective tape to a front surface of the wafer and making a diameter of the protective tape coincide with a diameter of the wafer; a holding step of holding the wafer through the protective tape by a holding table such that a back surface of the wafer is exposed; a grinding step of grinding the back surface of the wafer held by the holding table with use of grinding stones so as to thin the wafer to a thickness thinner than half of an original thickness, to reduce the diameter of the wafer, and to form a protruding portion where the protective tape protrudes from the wafer; and a contracting step of heating and contracting the protruding portion of the protective tape after the grinding step is carried out.

In accordance with another aspect of the present invention, there is provided a grinding apparatus for grinding a wafer that has a chamfered portion formed at a periphery thereof and is attached, at a front surface thereof, to a protective tape having a diameter same as that of the wafer. The grinding apparatus includes a holding table for holding the wafer through the protective tape; a grinding unit including a plurality of grinding stones for grinding the wafer held by the holding table; and a heating unit that heats and contracts a protruding portion where the protective tape protrudes from the wafer, the protruding portion having been formed as a result of reduction in diameter of the wafer when the wafer is ground by the grinding unit to be thinned to a thickness thinner than half of an original thickness.

Preferably, the grinding apparatus further includes a cleaning unit that cleans the wafer having been ground by the grinding unit, and the heating unit heats the protruding portion of the protective tape attached to the wafer having been cleaned by the cleaning unit.

According to the processing method of the present invention, it is possible to remove the protruding portion of the protective tape formed as a result of thinning of the wafer, and when the protective tape is to be subsequently peeled off from the wafer by using a peel tape, it is possible to prevent occurrence of such a defect that the protruding portion sticks to the dicing tape or the DAF.

Moreover, with the grinding apparatus of the present invention, the wafer is in a state in which the protruding portion of the protective tape has been removed, at the time of being unloaded from the cleaning unit, so that the problem relating to the protrusion of the protective tape can be solved in the grinding apparatus.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 5A is a side view, partially in cross section, for explaining a grinding step;

FIG. 5B is a sectional view for explaining thinning of the wafer;

FIG. 5C is a sectional view illustrating another form of a chamfered portion;

DETAILED DESCRIPTION OF THE PREFERRED EMBODIMENT

Figure 1:
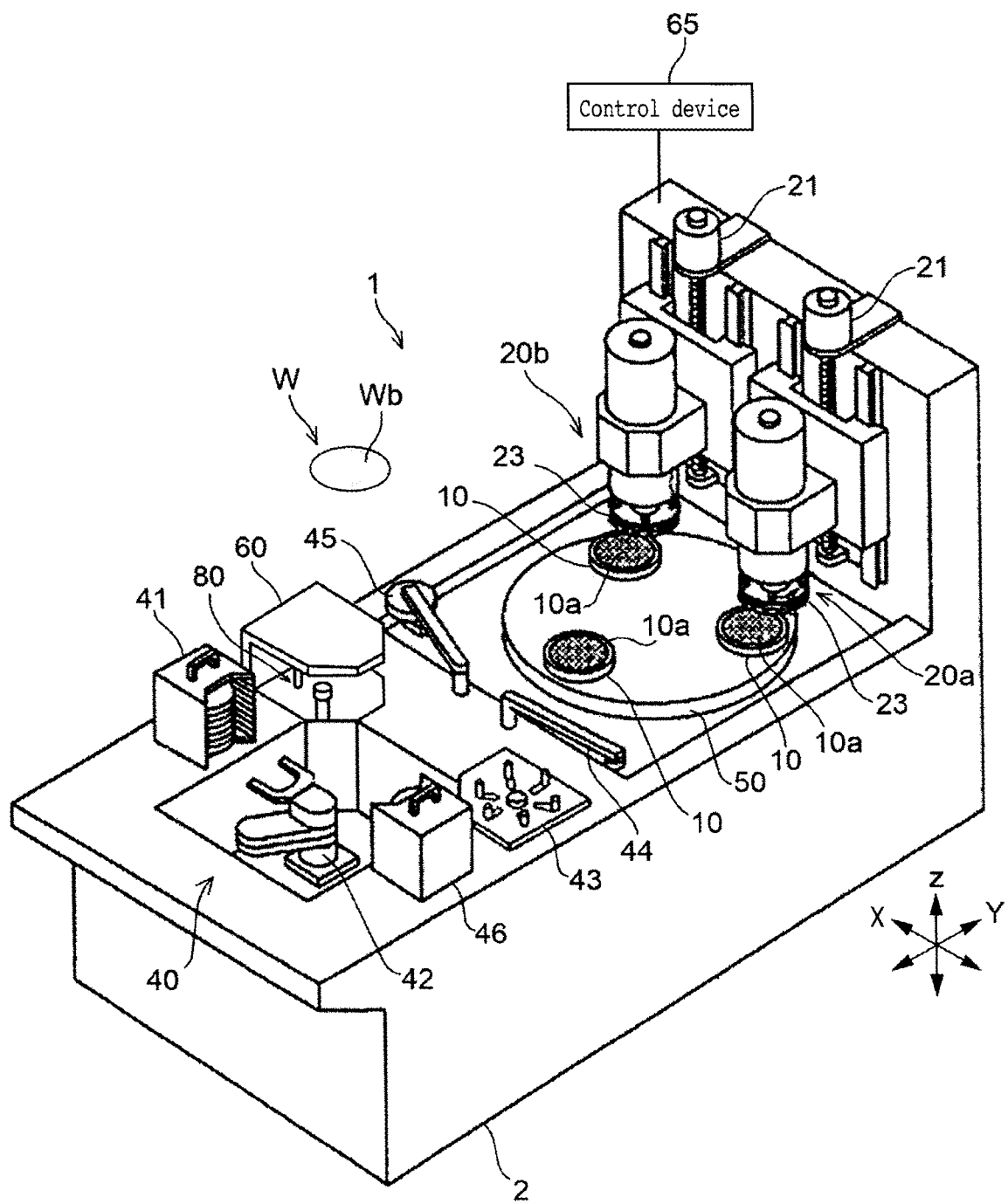
FIG. 1 is a perspective view illustrating a configuration example of a grinding apparatus according to an embodiment of the present invention.

FIG. 1 is a perspective view illustrating a configuration example of a grinding apparatus according to an embodiment of the present invention. A grinding apparatus 1 grinds a back surface Wb of a wafer W that is a workpiece to thin the wafer W. The wafer W to be processed is a disc-shaped semiconductor wafer or optical device wafer having a base material made of silicon, sapphire, or gallium nitride, for example.

Figure 2:
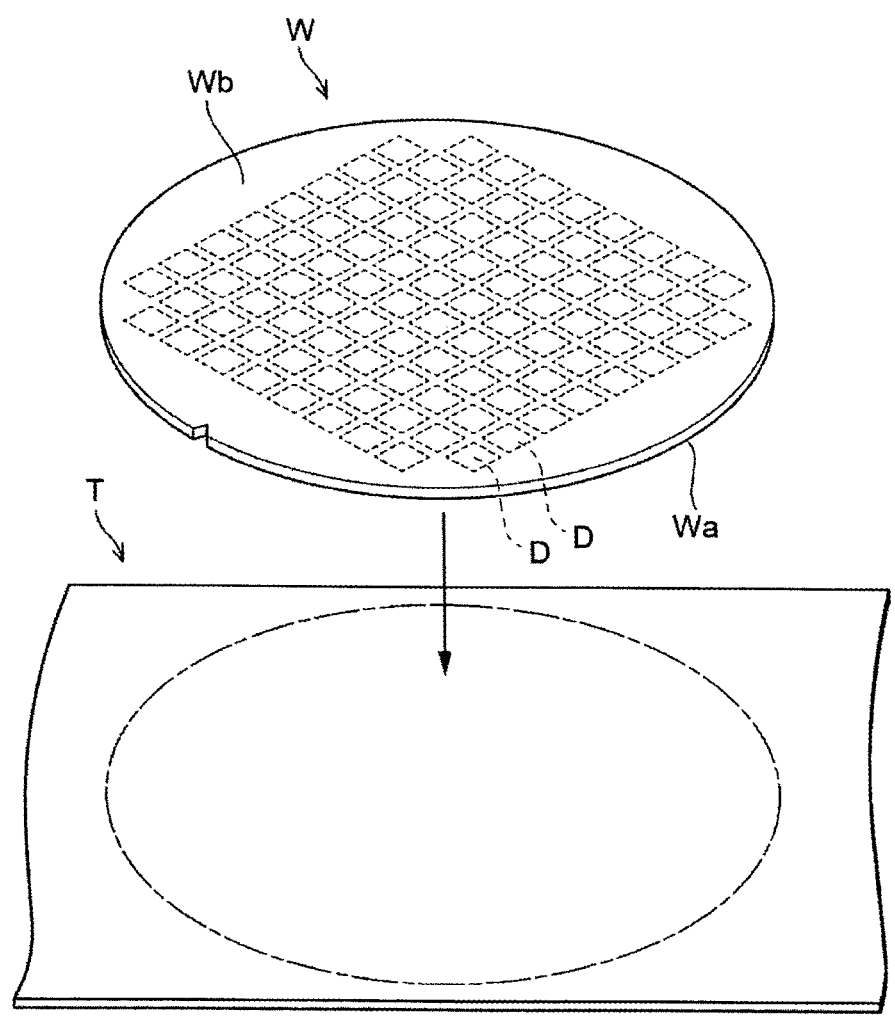
FIG. 2 is a perspective view of a back surface side of a wafer that is a workpiece.

FIG. 2 illustrates an example of the wafer W that is a workpiece. In the example of FIG. 2, the wafer W is placed such that a front surface Wa faces downward and the back surface Wb faces upward, and the front surface Wa side is attached to a protective tape T. The protective tape T, in the shape of a belt, is cut along an outer periphery of the wafer W to be integrated with the wafer W. The front surface Wa of the wafer W is partitioned by planned division lines formed in a grid pattern into a plurality of regions where respective devices D are formed.

As illustrated in FIG. 1, the grinding apparatus 1 includes holding tables 10 for holding wafers W, and first and second grinding units 20a and 20b for grinding the wafers W held by the holding tables 10. The grinding apparatus 1 further includes a delivering device 40, a turn table 50, a cleaning unit 60, a control device 65, and the like.

The delivering device 40 supplies wafers W yet to be ground onto the holding tables 10 and picks up wafers W having been ground. The delivering device 40 includes a loading cassette 46 for accommodating a plurality of wafers W yet to be ground, a delivering mechanism 42, a temporary placing part 43, a loading arm 44, an unloading arm 45, an unloading cassette 41 for accommodating a plurality of wafers W having been ground, and the like.

The loading cassette 46 and the unloading cassette 41 are same in configuration and placed at predetermined positions of an apparatus main body 2 of the grinding apparatus 1. The delivering mechanism 42 takes out one of the wafers W from the loading cassette 46 to place the wafer W on the temporary placing part 43, and stores a wafer W that has been ground by the first and second grinding units 20a and 20b and cleaned by the cleaning unit 60 into the unloading cassette 41. The loading arm 44 and the unloading arm 45 are, for example, arms for delivery that can rotate and move upward and downward.

The loading arm 44 picks up the wafer W from the temporary placing part 43 to place the wafer W on the holding table 10 at a loading/unloading position. The unloading arm 45 picks up the wafer W having been ground from the holding table 10 at the loading/unloading position to deliver the wafer W to the cleaning unit 60. The wafer W placed on the holding table 10 is subjected to grinding successively by the first and second grinding units 20a and 20b, delivered to the cleaning unit 60 by the unloading arm 45, cleaned by the cleaning unit 60, and stored into the unloading cassette 41 by the delivering mechanism 42.

The cleaning unit 60 is provided with a heating unit 80 that heats and contracts the protective tape T, which will be described later in detail with reference to FIG. 6A and FIG. 6B. It is to be noted that the heating unit 80 is provided for the purpose of heating the protective tape T attached to the wafer W that has been thinned. Therefore, the heating unit 80 may be positioned at a location different from the cleaning unit 60 as long as it can heat the protective tape T attached to the wafer W that has been thinned.

The turn table 50 is a disc-shaped table disposed on an upper surface of the apparatus main body 2, is able to rotate about its own axis extending along a z axis, and is suitably driven to rotate at predetermined timings. The turn table 50 has a plurality of holding tables 10 disposed thereon. In the present embodiment, three holding tables 10 are disposed on the turn table 50 at equal intervals of 120°, for example.

The holding tables 10 are each configured to hold thereon a wafer W under suction in such a manner that the back surface Wb of the wafer W is exposed. The holding table 10 is in a disc shape having a holding surface 10a made of a porous ceramic or the like, and is connected to a vacuum suction source not illustrated through a vacuum suction path not illustrated such that it can hold the wafer W placed on the holding surface 10a under suction through the protective tape T.

With the rotation of the turn table 50, the holding tables 10 rotate about the rotation axis of the turn table 50 extending along the z axis and, at the same time, individually rotate about their own axes extending along the z axis to thereby rotate the wafers W held thereon under suction accordingly. When the turn table 50 rotates, each of the holding tables 10 is moved to the loading/unloading position, a coarse grinding position, a finish grinding position, and the loading/unloading position in this order. When one holding table 10 is positioned at the loading/unloading position, which is the position closest to the delivering device 40, the wafer W is unloaded from the holding table 10 and another wafer W is loaded onto the holding table 10.

The first grinding unit 20a carries out coarse grinding on the back surface Wb of the wafer W, which is yet to be ground, held by the holding table 10 positioned at the coarse grinding position to thereby thin the wafer W. The second grinding unit 20b carries out finish grinding on the back surface Wb of the wafer W, which has been subjected to coarse grinding, held by the holding table 10 positioned at the finish grinding position to thereby further thin the wafer W.

The first and second grinding units 20a and 20b are processing-fed by respective processing-feed mechanisms 21. The processing-feed mechanisms 21 move the first and second grinding units 20a and 20b in a direction along the z axis to approach the respective wafers W held by the holding tables 10, thereby processing-feeding the first and second grinding units 20a and 20b. Further, the processing-feed mechanisms 21 move the first and second grinding units 20a and 20b in another direction along the z axis away from the respective wafers W held by the holding tables 10, thereby separating the first and second grinding units 20a and 20b from the respective wafers W. It is to be noted that the wafer W to be ground by the first grinding unit 20a is larger in thickness than the wafer W to be ground by the second grinding unit 20b.

The first and second grinding units 20a and 20b each include a spindle that projects downward and is driven by a motor, and a grinding wheel 23 that is fixed to a tip end of the spindle and is rotated about its own axis extending along the z axis at a high speed. The grinding wheels 23 each have grinding stones 23a (see FIG. 5A) that are used to grind the back surface Wb of the wafer W.

At the time of carrying out grinding by each of the first and second grinding units 20a and 20b, the grinding wheel 23 is processing-fed downward by the processing-feed mechanism 21 while being rotated about its own axis extending along the z axis, to thereby press the grinding stones against the back surface Wb of the wafer W. At this time, the holding table 10 is rotating about its own axis extending along the z axis to rotate the wafer W accordingly while, at the same time, a grinding water is supplied to the back surface Wb of the wafer W by grinding water supplying means not illustrated.

Figure 3:
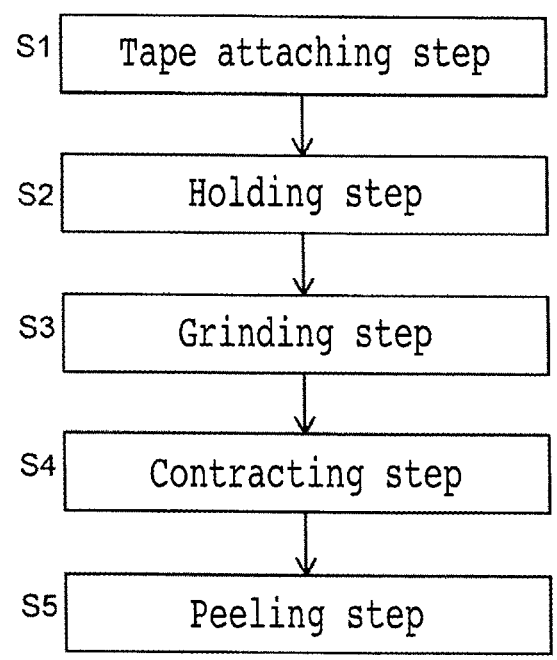
FIG. 3 is a flow chart illustrating a procedure of a wafer processing method according to the embodiment of the present invention.

An example of a processing method using the grinding apparatus 1 having the above-described configuration will be described next. FIG. 3 is a flow chart illustrating a procedure of the processing method to be described as follows.

<Tape Attaching Step>

A tape attaching step S1 is a step in which, as illustrated in FIG. 2, the protective tape T is attached to the front surface Wa of the wafer W and a diameter of the protective tape T is made coincide with a diameter of the wafer W.

Figure 4A:
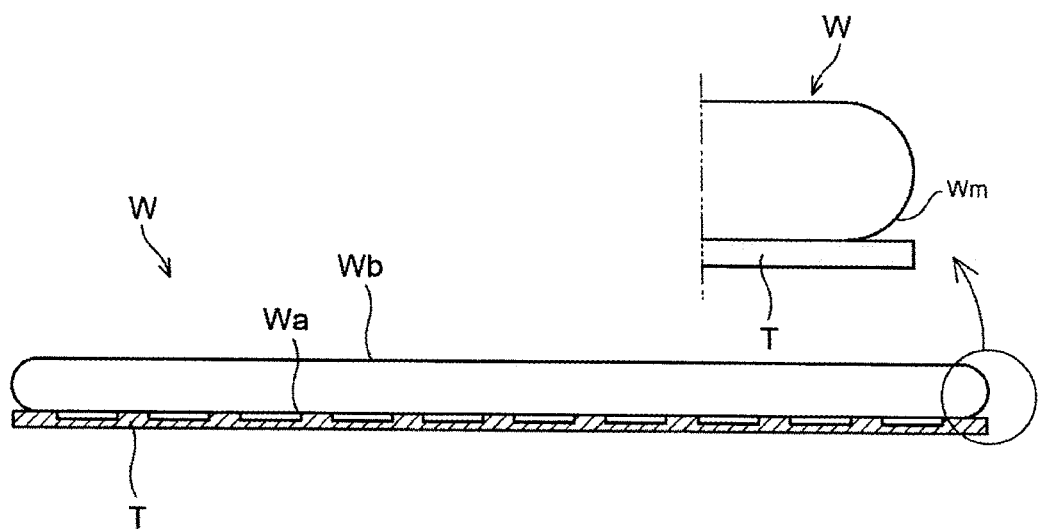
FIG. 4A is a side view, partially in cross section, illustrating a state in which a protective tape is attached to the wafer.

Specifically, after the wafer W is attached to the protective tape T larger in size than the wafer W, the protective tape T is cut along the outer periphery of the wafer W by using a cutter, so that the maximum diameter of the wafer W is substantially the same as the diameter of the protective tape T as illustrated in FIG. 4A.

As illustrated in an enlarged part of FIG. 4A, a chamfered portion Wm is formed at the outer peripheral portion of the wafer W.

<Holding Step>

Figure 4B:
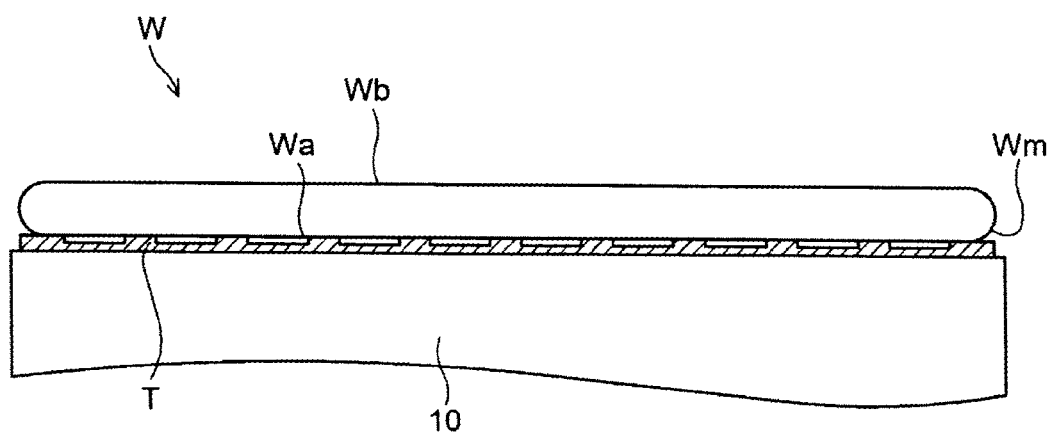
FIG. 4B is a side view, partially in cross section, illustrating a state in which the wafer is held by a holding table.

A holding step S2 is a step in which, as illustrated in FIG. 4B, the wafer W is held through the protective tape T by the holding table 10 such that the back surface Wb is exposed.

Specifically, as illustrated in FIG. 1, one of the wafers W accommodated in the loading cassette 46 is loaded onto the holding table 10 to be held under suction by the holding table 10.

<Grinding Step>

A grinding step S3 is a step in which, as illustrated in FIG. 5A and FIG. 5B, the back surface Wb of the wafer W held by the holding table 10 is ground by the grinding stones 23a, to thereby thin the wafer W to a thickness thinner than half of the original thickness. It is to be noted that the original thickness of the wafer W means the thickness before being ground.

Specifically, as illustrated in FIG. 1, coarse grinding and finish grinding are carried out successively by the first and second grinding units 20a and 20b, to thereby thin the wafer W to a thickness H thinner than half of the original thickness as illustrated in FIG. 5B.

As illustrated in FIG. 5B, the thinning reduces an original diameter D1 of the wafer W to a diameter D2, and the protective tape T protrudes from the wafer W by a protruding amount M1 to thereby form a protruding portion Tm.

It is to be noted that, while the chamfered portion Wm formed at the outer peripheral portion of the wafer W is in an arcuate shape in the example illustrated in FIG. 5B, a chamfered portion Wn having an inclined plane shape as illustrated in FIG. 5C may sometimes be formed depending on the type of the wafer. In the case of the wafer having such a chamfered portion Wn as illustrated in FIG. 5C as well, thinning causes the protective tape T to largely protrude.

<Contracting Step>

Figure 6A:
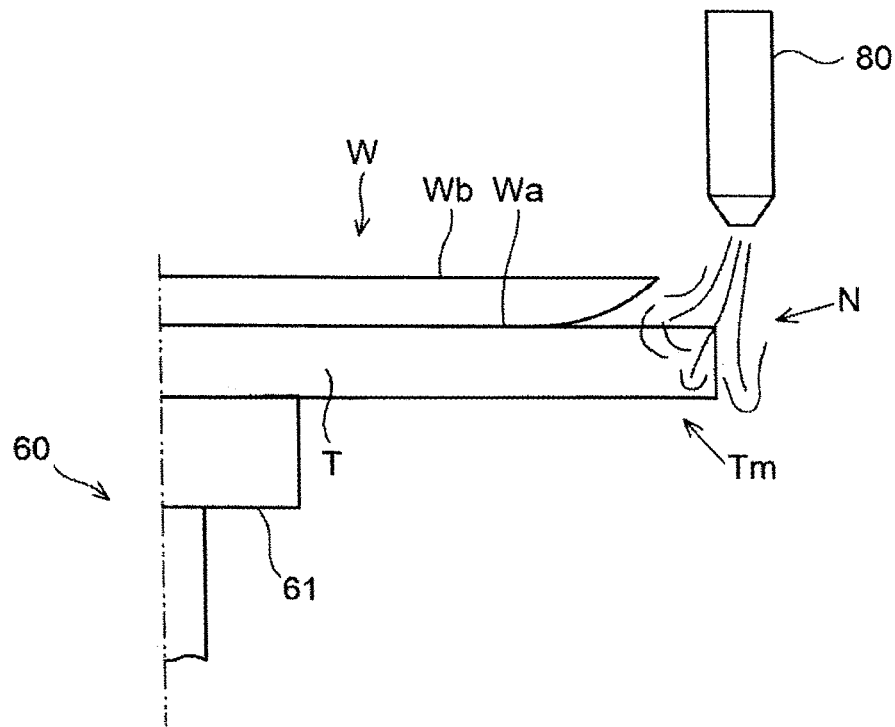
FIG. 6A is a sectional view for explaining a contracting step.
Figure 6B:
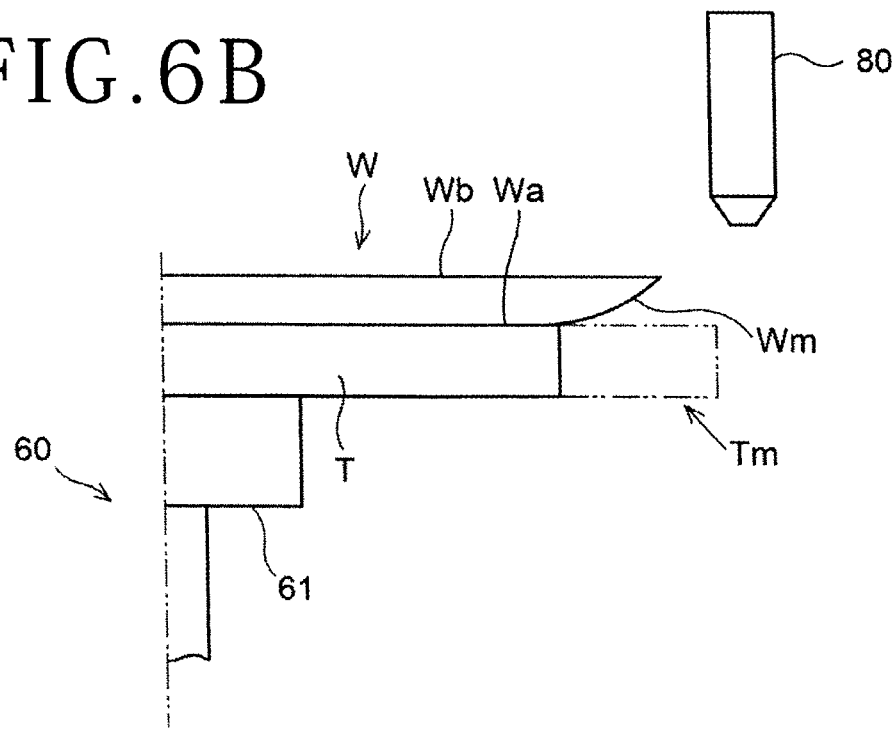
FIG. 6B is a sectional view illustrating a state in which a protruding portion is removed as a result of contraction.

A contracting step S4 is a step in which, as illustrated in FIG. 6A and FIG. 6B, the protruding portion Tm of the protective tape T is heated and contracted.

In the present embodiment, the heating unit 80 including a heat gun for jetting hot air N jets the hot air N to the protective tape T. It is preferable that a time period for jetting and a temperature of the hot air N sufficient for contracting the protruding portion Tm be determined in advance, depending on the material and thickness of the protective tape T, through experiments. The temperature of the hot air N can be, for example, set to 90° C. to 120° C.

The heating unit 80 is disposed in the cleaning unit 60 as illustrated in FIG. 1 and is configured to jet the hot air N to the wafer W placed on a spinner table 61 of the cleaning unit 60, as illustrated in FIG. 6A, after cleaning of the wafer W.

It is to be noted that, while the heating unit 80 jets the hot air N to the protective tape T from above (from the wafer W side) in the example of FIG. 6A, it may otherwise jet the hot air N to the protective tape T from below (from the protective tape T side). Further, a lamp or the like may be used as the heating unit, in place of a heat gun.

In this manner, the protective tape T is contracted, so that the protruding portion Tm protruding from the wafer W is removed as illustrated in FIG. 6B.

<Peeling Step>

Figure 7:
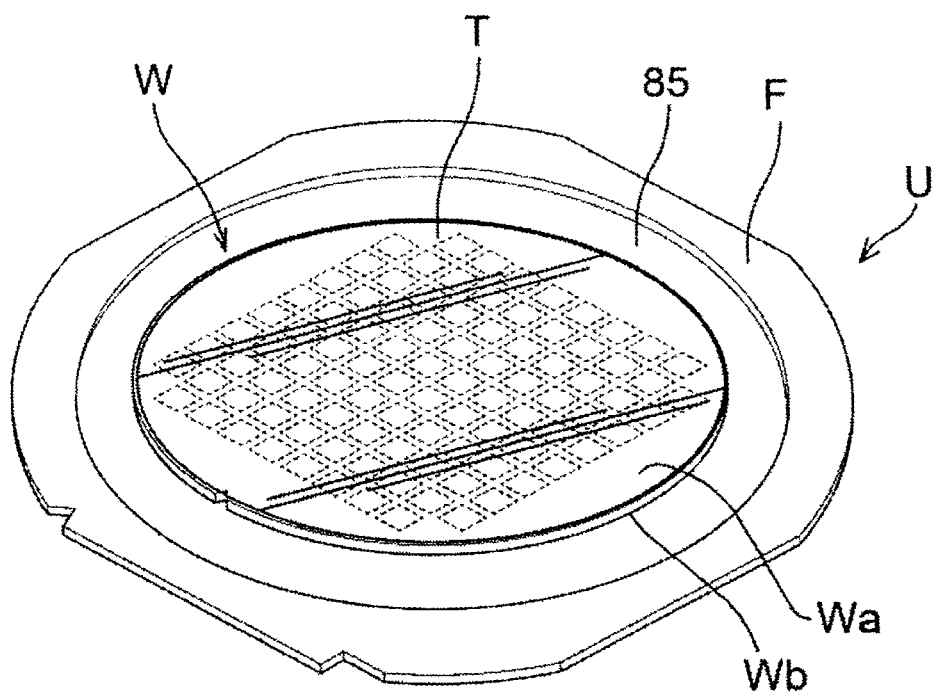
FIG. 7 is a perspective view illustrating a wafer unit.

A peeling step S5 is a step in which, as illustrated in FIG. 7, the wafer W from which the protruding portion Tm has been removed is placed upside down and attached to a dicing tape 85 such that the protective tape T are exposed to face upward.

It is to be noted that, as illustrated in FIG. 7, an annular frame F is also attached to the dicing tape 85 such that the wafer W and the annular frame F are integrated with each other to form a wafer unit U and to be handled as the wafer unit U.

Figure 8A:
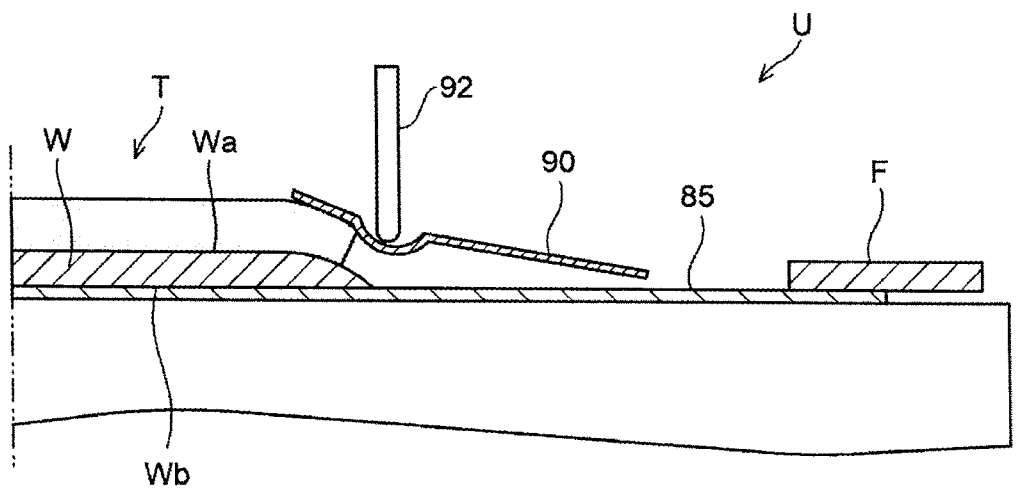
FIG. 8A is a sectional view illustrating how a peel tape is attached.

Peeling of the protective tape T is then carried out by using a peel tape 90 as illustrated in FIG. 8A. The peel tape 90 is disposed so as to stride across an outer peripheral edge of the wafer W and pressed against the protective tape T by a pressing mechanism 92.

At this time, although the protective tape T is pressed together with the peel tape 90, since protrusion of the protective tape T from the wafer W has been removed in the contracting step S4 described above, the protective tape T does not stick to the dicing tape 85.

Figure 8B:
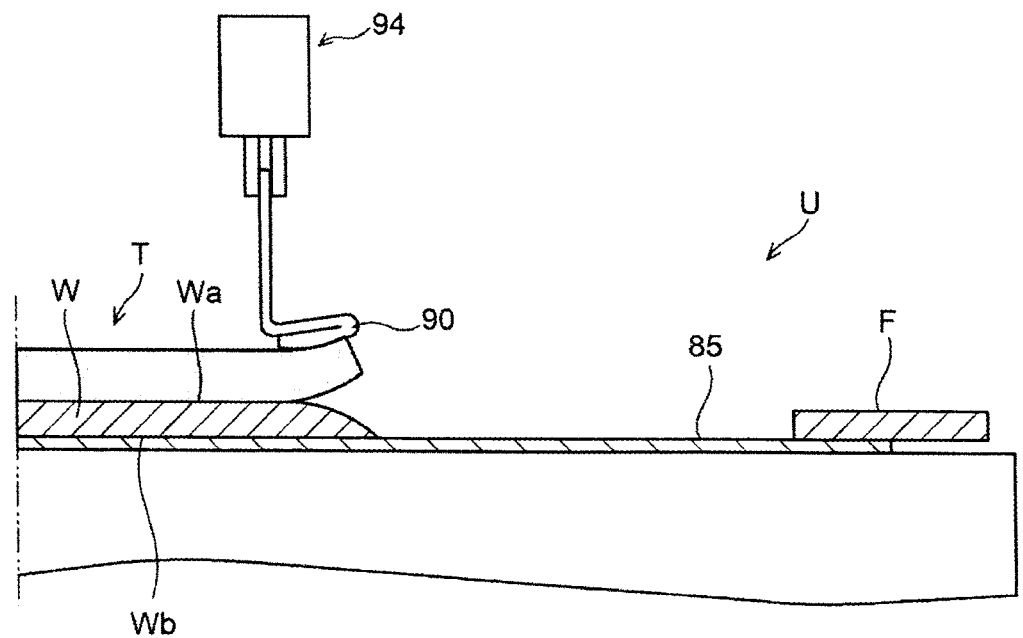
FIG. 8B is a sectional view for explaining peeling of the protective tape.
Figure 9A:
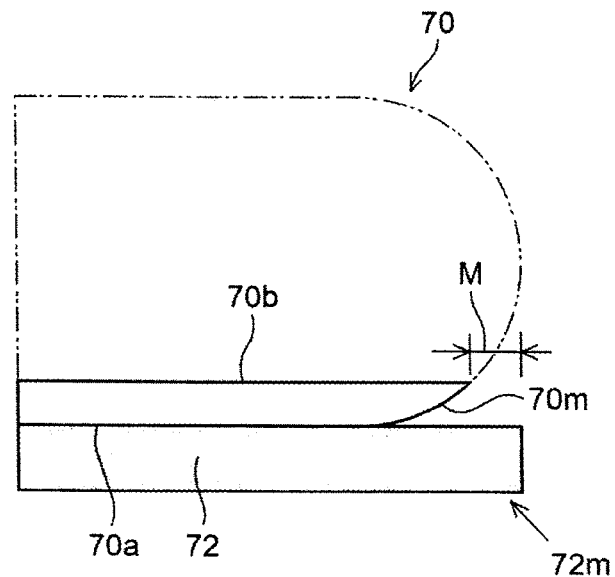
FIG. 9A is a sectional view illustrating protrusion of a protective tape in a conventional technology.
Figure 9B:
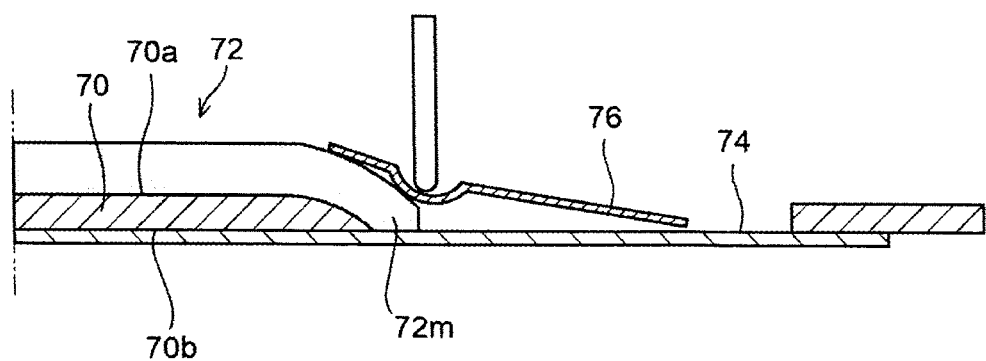
FIG. 9B is a sectional view illustrating how a peel tape is attached in the conventional technology.

The peel tape 90 is then pulled up by a peeling mechanism 94 as illustrated in FIG. 8B, so that the protective tape T can be peeled off from the wafer W.

Since the protrusion of the protective tape T from the wafer W has been removed in this manner, the protective tape T does not stick to the dicing tape 85 in the course of peeling of the protective tape T, so that it is possible to smoothly peel off the protective tape T from the wafer W.

The present invention is not limited to the details of the above-described preferred embodiment. The scope of the invention is defined by the appended claims and all changes and modifications as fall within the equivalence of the scope of the claims are therefore to be embraced by the invention.

What is claimed is:

1. A wafer processing method for processing a wafer having a chamfered portion formed at a periphery thereof, comprising:
    a tape attaching step of attaching a protective tape to a front surface of the wafer and making a diameter of the protective tape coincide with a diameter of the wafer;
    a holding step of holding the wafer through the protective tape by a holding table such that a back surface of the wafer is exposed;
    a grinding step of grinding the back surface of the wafer held by the holding table with use of grinding stones so as to thin the wafer to a thickness thinner than half of an original thickness, to reduce the diameter of the wafer, and to form a protruding portion where the protective tape protrudes from the wafer; and
    a contracting step of heating and contracting the protruding portion of the protective tape after the grinding step is carried out while the wafer is not attached to a dicing tape.

2. The wafer processing method according to claim 1, wherein in the contracting step, the protruding portion of the protective tape is heated without the wafer flipping after the grinding step.

3. The wafer processing method according to claim 1, wherein in the contracting step, the protruding portion of the protective tape is heated while the protruding portion is exposed.

4. A grinding apparatus for grinding a wafer that has a chamfered portion formed at a periphery thereof and is attached, at a front surface thereof, to a protective tape having a diameter same as that of the wafer, comprising:
    a holding table for holding the wafer through the protective tape;
    a grinding unit including a plurality of grinding stones for grinding the wafer held by the holding table; and
    a heating unit that heats and contracts a protruding portion where the protective tape protrudes from the wafer, the protruding portion having been formed as a result of reduction in diameter of the wafer when the wafer is ground by the grinding unit to be thinned to a thickness thinner than half of an original thickness; and
    a table, wherein the wafer, which is not attached to a dicing tape, is placed on the table when the heating unit is heating and contracting the protruding portion of the protective tape.

5. The grinding apparatus according to claim 4, further comprising:
    a cleaning unit that cleans the wafer having been ground by the grinding unit, wherein the cleaning unit includes the table and the table is a spinner table,
    wherein the heating unit heats the protruding portion of the protective tape attached to the wafer having been cleaned by the cleaning unit.

6. The grinding apparatus according to claim 5, wherein the heating unit comprises a lamp.

7. The grinding apparatus according to claim 5, wherein the heating unit comprises a heat gun.

8. The grinding apparatus according to claim 4, wherein the wafer after grinding by the grinding unit is placed on the table without being flipped.

9. The grinding apparatus according to claim 4, wherein the table is configured such that the wafer can be placed on the table with the protruding portion of the protective tape exposed.

10. A wafer processing method for processing a wafer having a chamfered portion formed at a periphery thereof, comprising:
    a tape attaching step of attaching a protective tape to a front surface of the wafer and making a diameter of the protective tape coincide with a diameter of the wafer;
    a holding step of holding the wafer through the protective tape by a holding table such that a back surface of the wafer is exposed;
    a grinding step of grinding the back surface of the wafer held by the holding table with use of grinding stones so as to thin the wafer to a thickness thinner than half of an original thickness, to reduce the diameter of the wafer, and to form a protruding portion where the protective tape protrudes from the wafer;
    a contracting step of heating and contracting the protruding portion of the protective tape after the grinding step is carried out; and
    a peeling step of peeling the protective tape off of the wafer by disposing a peeling tape across an outer peripheral edge of the wafer, pressing the peeling tape against the protective tape by a pressing mechanism, and pulling the peeling tape and the protective tape off of the wafer.

* * * * *